(12) United States Patent
Nakamura

(10) Patent No.: US 6,838,718 B2
(45) Date of Patent: Jan. 4, 2005

(54) FERROELECTRIC CAPACITOR AND FERROELECTRIC MEMORY

(75) Inventor: Takashi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 146 days.

(21) Appl. No.: 10/093,619

(22) Filed: Mar. 11, 2002

(65) Prior Publication Data
US 2002/0125517 A1 Sep. 12, 2002

Related U.S. Application Data

(63) Continuation-in-part of application No. 09/671,355, filed on Sep. 27, 2000, now abandoned.

(30) Foreign Application Priority Data

Sep. 28, 1999 (JP) ........................................ P. 11-275295

(51) Int. Cl.$^7$ ............................................. H01L 29/72
(52) U.S. Cl. ........................ 257/295; 257/296; 257/301; 257/305
(58) Field of Search ................................ 257/295, 301, 257/305

(56) References Cited

U.S. PATENT DOCUMENTS

| 4,853,893 A | | 8/1989 | Eaton, Jr. et al. | |
| 5,383,150 A | * | 1/1995 | Nakamura et al. | ........... 257/295 |
| 5,812,442 A | | 9/1998 | Yoo | ............................ 365/145 |

FOREIGN PATENT DOCUMENTS

| EP | 0299633 A2 | 1/1989 | |
| EP | 0 299 633 | 1/1989 | ................. 257/295 |
| EP | 0469934 A2 | 2/1992 | |
| EP | 0837504 A3 | 8/1997 | |
| EP | 0837504 A2 | 4/1998 | |
| EP | 1035587 A1 | 9/2000 | |
| JP | 06104447 | 4/1994 | |
| JP | 08-51165 | 2/1996 | |
| WO | WO 9912210 A | 3/1999 | |

OTHER PUBLICATIONS

Hiroshi Ishiwara: "Proposal of a Novel Ferroelectric–Gate Field Effect Transistor With Separated Functions for Data Read–Out and Data Storage"; Extended Abstracts of the International Conference on Solid State Devices and Materials, Japan Society Applied Physics, Sep. 1998 (19998–09) XP–000823151; pp. 222–223.

* cited by examiner

Primary Examiner—Edward Wojciechowicz
(74) Attorney, Agent, or Firm—Morgan, Lewis & Bockius LLP

(57) ABSTRACT

A ferroelectric memory comprising a select transistor and a ferroelectric capacitor is characterized in that the ferroelectric capacitor includes a dummy capacitor and a memory capacitor the first electrodes (storage node electrodes) of which are connected to one of the source and drain of the select transistor and which draw the same hysteresis curve, the second electrodes of the dummy capacitor and the memory capacitor are connected to a first plate line and a second plate line, and the potentials of these plate lines are set so as to polarize the dummy capacitor and the memory capacitor in opposite directions to each other with respect to the first electrode.

18 Claims, 6 Drawing Sheets

FIG. 5
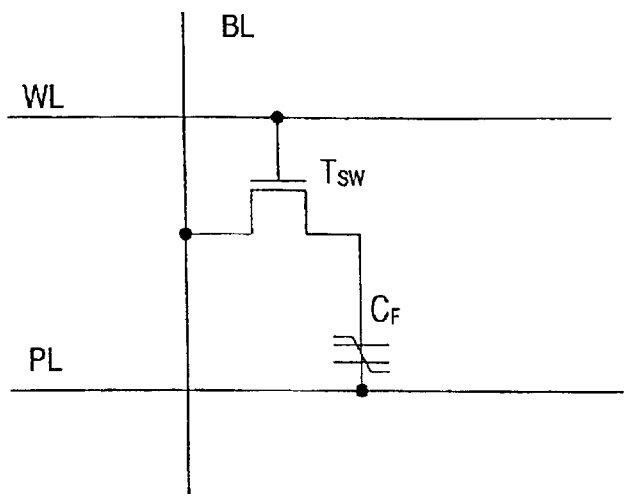
FIG. 6
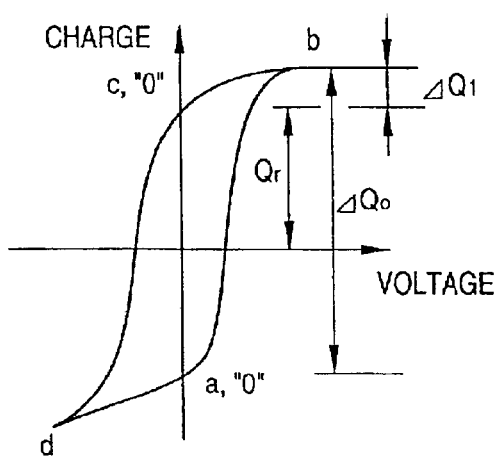
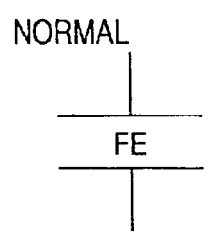
FIG. 7A   FIG. 7B
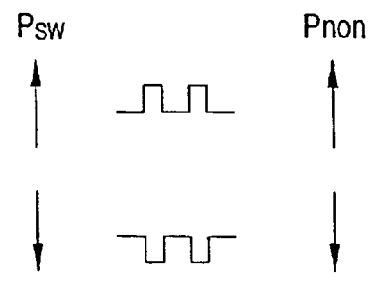
FIG. 7C   FIG. 7D

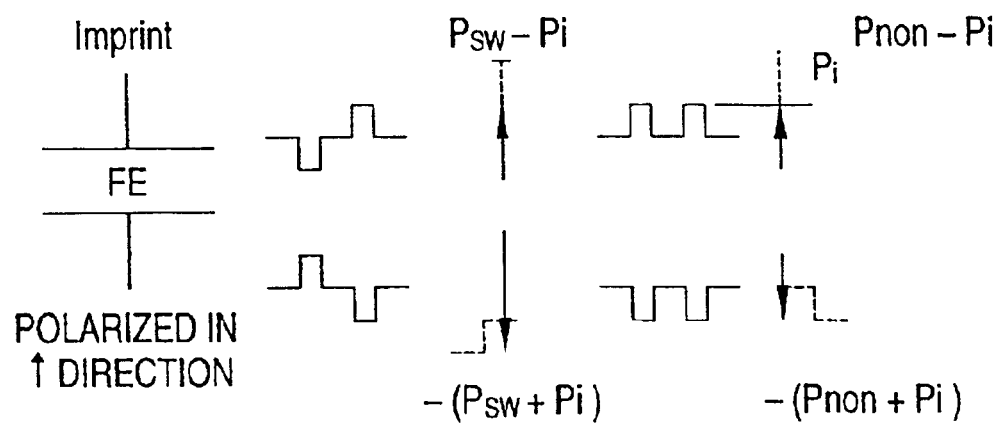

US 6,838,718 B2

FERROELECTRIC CAPACITOR AND FERROELECTRIC MEMORY

This is a continuation-in-part of application Ser. No. 09/671,355 filed on Sep. 27, 2000 now abandoned.

BACKGROUND OF THE INVENTION

1. Field of the Invention

The present invention relates to a ferroelectric memory, and more particularly to a ferroelectric memory using a ferroelectric capacitor.

2. Description of the Related Art

The ferroelectric memory which is being researched nowadays is roughly classified into two systems. The one is a memory of a system in which the quantity of inverted charges of a ferroelectric capacitor is detected. This system, as seen from an equivalent circuit diagram shown in FIG. 5, includes a ferroelectric capacitor $C_F$ and a select transistor $T_{SW}$.

The other is a memory of the system in which a change in the resistance of semiconductor due to spontaneous polarization of ferroelectric is detected. A representative system thereof is an MFSFET. This MFSFET is an FET in a MIS structure using ferroelectric for a gate insulating film.

The former ferroelectric memory can hold charges of two values of "0" and "1" in a single ferroelectric capacitor. For example, as understood from the hysteresis characteristic as shown in FIG. 6, where the storage information of "0" is written, with the voltage applied to the capacitor being minus (with a select transistor $T_{SW}$ being on, a minus potential is applied to a bit line BL and a plus potential is applied to a plate line PL) after having passed point d, the applied voltage is restored to zero. In this case, the polarized value results in a residual polarized point "a" so that the storage information of "0" can be written. On the other hand, where storage information of "1" is written, with the voltage applied to the capacitor being plus, after having passed point "b", the applied voltage is restored to zero. In this case, the polarized value results in a residual polarized point c so that the storage information of "1" can be written.

The read of data can be executed in such a manner that the quantity of charges flowing into the bit line when the voltage is applied to the capacitor is detected.

The charges flowing from the ferroelectric capacitor into the bit line changes the potential on the bit line. The bit line has a parasitic bit line capacitance Cb generated because of the presence of the bit line itself When the select transistor is turned on to select the memory to be read, according to the information stored in each selected memory cell, the charge is outputted onto the bit line. The value obtained when this charge is divided by the entire capacitance of the bit line represents the potential on the bit line.

A difference between the bit line potentials is read in comparison with a predetermined reference potential.

Where a signal varying from (−) to (+) is applied to an ordinary capacitor $C_{FE}$, as seen from FIG. 7A, residual dielectric polarization $P_{SW}$ is generated. On the other hand, where the signal varying from (+) to (−) is applied to the capacitor $C_{FE}$, as seen from FIG. 7B, residual dielectric polarization $-P_{SW}$ is generated. Where a signal not varying while remaining (+) is applied to the capacitor $C_{FE}$, as seen from FIG. 7C, residual dielectric polarization $P_{non}$ is generated. Where a signal not varying while remaining (−) is applied to the capacitor $C_{FE}$, as seen from FIG. 7D, residual dielectric polarization $-P_{non}$ is generated.

The bit line potential based on the above residual dielectric polarization is read in comparison with the reference voltage so that the read of the stored data is executed.

Meanwhile, the ferroelectric capacitor has an "imprint characteristic" that the residual dielectric polarization generated after written is held. The quantity of held polarization is a value peculiar to the ferroelectric capacitor.

Now it is assumed that the signal corresponding to FIGS. 7A to 7D like the above case has been applied to the ferroelectric capacitor holding the imprinted polarization of $-P_i$. Where a signal varying from (−) to (+) is applied to the imprinted ferroelectric capacitor, as seen from FIG. 8A, residual dielectric polarization $P_{SW} - P_i$ is generated. On the other hand, where the signal varying from (+) to (−) is applied to the capacitor, as seen from FIG. 8B, residual dielectric polarization $-(P_{SW} + P_i)$ is generated. Where a signal not varying while remaining (+) is applied to the capacitor, as seen from FIG. 8C, residual dielectric polarization $P_{non} - P_1$ is generated. Where a signal not varying while remaining (−) is applied to the capacitor $C_{FE}$, as seen from FIG. 8D, residual dielectric polarization $-(P_{non} + P_i)$ is generated.

Such an imprint characteristic becomes gradually remarkable with an increase in the number of times of write. This leads to failure of read because of a small margin in decision.

SUMMARY OF THE INVENTION

The present invention has been accomplished under the above circumstance, and intends to provide a ferroelectric capacitor which can prevent the failure of read due to an "imprint characteristic", has a long life and can execute a storage operation with great reliability.

The ferroelectric capacitor according to the invention is characterized in that it comprises a first capacitor and a second capacitor having the first electrodes (storage node electrodes) connected to each other and drawing the same hysteresis curve, the second electrodes of these first and second capacitors are connected to a first plate line and a second plate line, respectively and the potentials of these plate lines are set so as to polarize the first capacitor and the second capacitor in opposite directions to each other with respective to the first electrodes.

The second invention provides a ferroelectric memory comprising a select transistor and a ferroelectric capacitor characterized in that the ferroelectric capacitor includes a dummy capacitor and a memory capacitor the first electrodes (storage node electrodes) of which are connected to one of the source and drain of the select transistor and which draw the same hysteresis curve, the second electrodes of the dummy capacitor and the memory capacitor are connected to a first plate line and a second plate line, and the potentials of these plate lines are set so as to polarize the dummy capacitor and the memory capacitor in opposite directions to each other with respect to the first electrode.

This ferroelectric memory is characterized by that the dummy capacitor and the memory capacitor are polarized in opposite directions to each other at a memory write operation. For example, on a data writing of "1," the memory capacitor and the dummy capacitor are polarized in opposite directions as shown in FIG. 1A. At data reading from the memory, an electric potential is applied to the dummy capacitor as a read out preparation, as shown in FIG. 1B. At this state, the polarization directions of the capacitors do not change. Assuming that imprinted polarization direction to be the opposite direction of the polarization direction of the dummy capacitor shown in FIG. 1B, charge amount of the dummy capacitor is Psw+Pi and the residual charge amount is Pnon−Pi, as shown in previously explained FIG. 8C. Thus the composite charge amount is Psw+Pnon.

While, in a case of "0" is written to the ferroelectric memory of the invention, as shown in FIG. 2A, the polarization directions of the capacitors are in the opposite directions, respectively, from the polarization directions shown in FIG. 1A. Starting from this state, the dummy capacitor is supplied an electric potential, so that the polarization direction of the dummy capacitor is reversed (FIG. 2B). Assuming that the imprinted polarization direction is the same as the polarization direction shown in FIG. 1B, the charge amount of the dummy capacitor is Psw−Pi. Next, as shown in FIG. 2C, a read out potential is given to the memory capacitor. The polarization direction of the dummy capacitor is not changed, and the charge amount of the dummy capacitor is Pnon−Pi. The polarization direction of the memory capacitor is not reversed, so that the charge amount including the imprinted charge amount is Pnon+Pi. The composite charge amount of the dummy capacitor and the memory capacitor is Pnon+Pnon.

As shown above, in the present invention, it is possible to obtain a composite capacitance from which influences of residual capacitance caused by imprint polarizations, and further a high precision ferroelectric memory with small malfunctions.

In third invention, in the ferroelectric memory according to claim 2, the ferroelectric capacitor is formed in a sandwiching structure in which a ferroelectric layer is sandwiched by the first electrodes which are a common electrode connected to one of the source and drain of the select transistor and the second electrodes which are first and second individual electrodes connected to the first and the second plate line, respectively.

In this configuration, the one electrode of the ferroelectric memory comprising an ordinary select transistor and a ferroelectric capacitor has only to be formed in a divided structure, thus providing the ferroelectric memory having a very simple structure. Since the memory capacitor and dummy capacitor are formed using the same ferroelectric layer and electrode, their characteristics can be made uniform with great accuracy, thus providing a ferroelectric memory with high reliability.

In the ferroelectric memory defined in claim 3, preferably, the ferroelectric layer is formed integrally.

In this configuration, the memory capacitor and dummy capacitor can be formed more easily, and their imprint characteristic can made uniform with great accuracy, thereby providing a reliable ferroelectric memory.

In the ferroelectric memory defined in claim 3, preferably, the ferroelectric layer is divided so as to correspond to the first and second individual electrodes.

In this configuration, since the ferroelectric layer is completely separated into two parts, the polarized states of the capacitors are not influenced from each other and their imprint characteristic can be cancelled satisfactorily. If the ferroelectric layer formed in the same step is pattern-separated into two parts, their imprint characteristic can be made uniform with higher accuracy, thereby improving the reliability of the ferroelectric memory.

Further the present invention is applicable to MFSFET structure of ferroelectric memory.

BRIEF DESCRIPTION OF THE DRAWINGS

FIG. 5 is a view of an equivalent circuit of the ferroelectric memory according to a prior art.

FIG. 6 is a graph showing the operation of a ferroelectric memory.

FIG. 7 is a view for explaining the imprint characteristic.

FIG. 8 is a view for explaining the imprint characteristic.

DESCRIPTION OF THE PREFERRED EMBODIMENTS

As an embodiment of the invention, an explanation will be given of a ferroelectric memory using a ferroelectric film of PZT.

Figure 3:
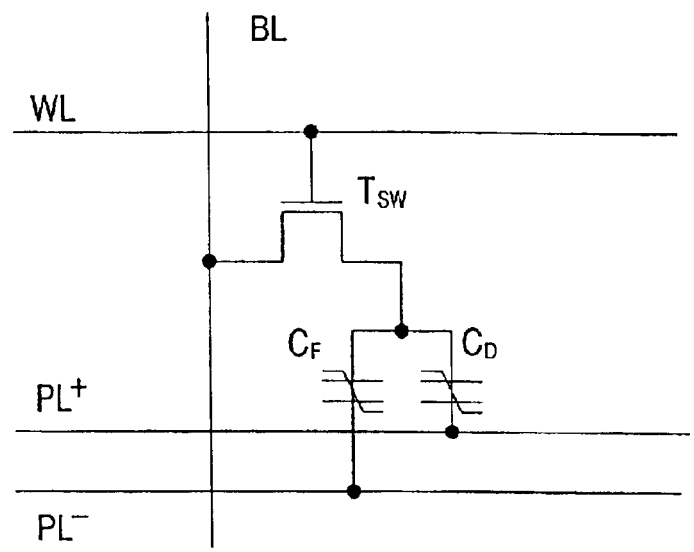
FIG. 3 is a view of an equivalent circuit of the ferroelectric memory according to the first embodiment of the invention.
Figure 4:
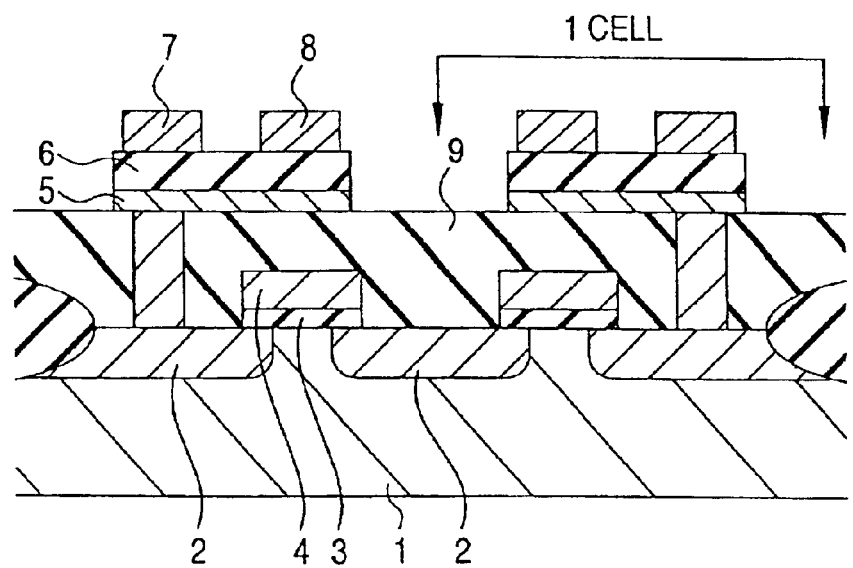
FIG. 4 is a view showing the structure of the ferroelectric memory according to the first embodiment of the invention.

FIG. 3 is an equivalent circuit diagram of the ferroelectric memory, and FIG. 4 is a sectional view thereof. As seen from these figures. the ferroelectric memory is characterized in that it includes a dummy capacitor $C_D$ and a memory capacitor $C_F$ the first electrodes (storage node electrodes) of which are connected to one of the source and drain of a select transistor $T_{SW}$ and which draw the same hysteresis curve, the second electrodes of these capacitors $C_D$ and $C_F$ are connected to a first plate line $PL^+$ and a second plate line $PL^-$, and the potentials of these plate lines are set so as to polarize the dummy capacitor $C_D$ and the memory capacitor $C_F$ in opposite directions to each other.

As seen from the sectional view of FIG. 4, the ferroelectric memory includes an MOSFET serving as a select transistor consisting of source/drain layers 2 of p-type impurity regions formed on the surface of an n-type Si substrate 1 and a gate electrode formed between the source/drain regions through a gate insulating film 3; and a ferroelectric capacitor consisting of a storage node electrode 5 formed so as to be in contact with one of the source/drain electrodes, a ferroelectric film 6 formed on the storage nods electrode 5, and a first and a second plate electrode 7 and 8 formed on the ferroelectric film 6 and having equal areas. The ferroelectric capacitor consists of a dummy capacitor CD formed with the storage node electrode 5 and the first plate electrode 7 and a memory capacitor CF formed with the storage node 5 and the second plate electrode 8. These first and second plate electrodes are connected to the first plate line $PL^+$ and the second plate line $PL^-$, respectively and hold their polarization in opposite directions to each other.

Now it should be noted that the gate electrode is made of a poly-silicon film and the storage node electrode and plate electrode are made of a two-layer structure of Iridium and Iridium oxide and the ferroelectric layer is made of a PZD layer. Incidentally, reference numeral 9 denotes an interlayer insulating film of silicon oxide.

Figure 1A:
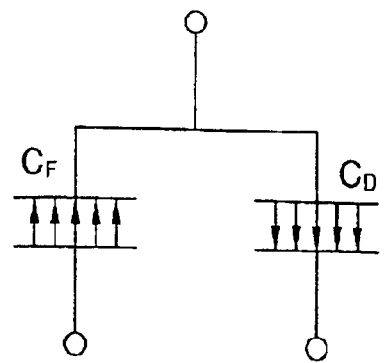
FIG. 1 is a view for explaining the operating theory of a ferroelectric memory according to the first embodiment of the invention.
Figure 1B:
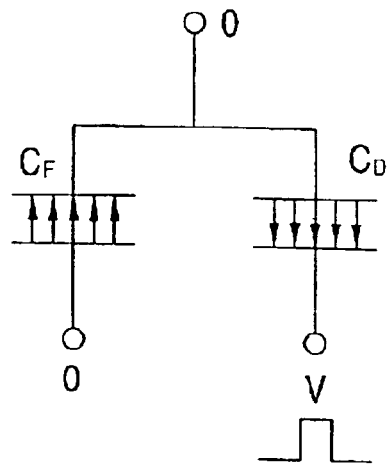
Figure 1C:
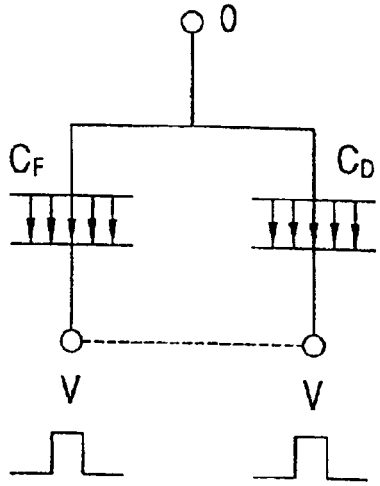

An explanation will be given of the operation of the ferroelectric memory. This ferroelectric memory is characterized by that the dummy capacitor and the memory capacitor are polarized in opposite directions to each other at a memory write operation. For example, on a data writing of "1", the memory capacitor and the dummy capacitor are polarized in opposite directions as shown in FIG. 1A. At data reading from the memory, an electric potential is applied to the dummy capacitor as a read out preparation, as shown in FIG. 1B. At this state, the polarization directions of the capacitors do not change. Assuming that imprinted polarization direction to be the opposite direction of the polarization direction of the dummy capacitor shown in FIG. 1B, charge amount of the dummy capacitor is Psw+Pi and the residual charge amount is Pnon−Pi, as shown in previously explained FIG. 8C. Thus the composite charge amount is Psw+Pnon.

Figure 2A:
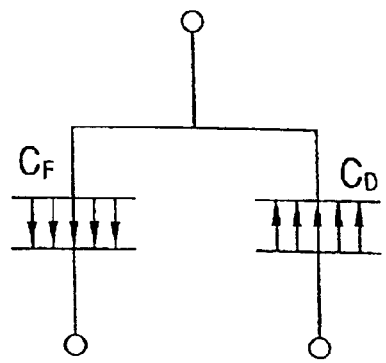
FIG. 2 is a view for explaining the operating theory of a ferroelectric memory according to the first embodiment of the invention.
Figure 2B:
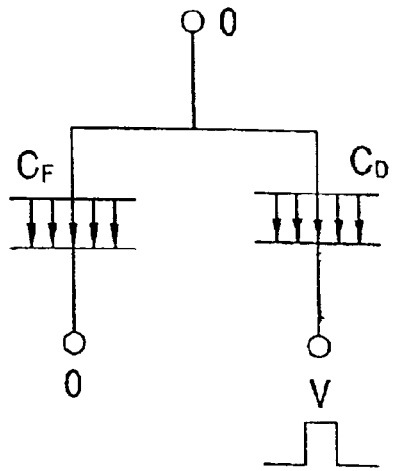
Figure 2C:
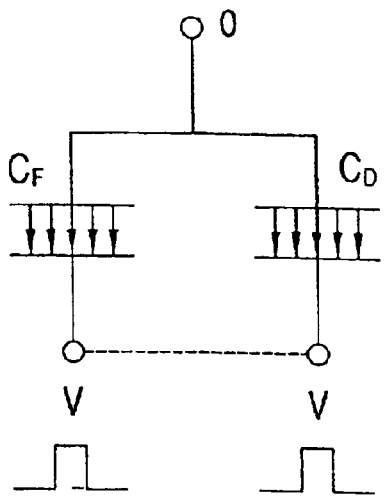

While, in a case of "0" is written to the ferroelectric memory of the invention, as shown in FIG. 2A, the polarization directions of the capacitors are in the opposite directions, respectively, from the polarization directions shown in FIG. 1A. Starting from this state, the dummy capacitor is supplied an electric potential, so that the polarization direction of the dummy capacitor is reversed (FIG. 2B). Assuming that the imprinted polarization direction is the same as the polarization direction shown in FIG. 1B, the charge amount of the dummy capacitor is Psw−Pi. Next, as shown in FIG. 2C, a read out potential is given to the memory capacitor. The polarization direction of the dummy capacitor is not changed, and the charge amount of the dummy capacitor is Pnon−Pi. The polarization direction of the memory capacitor is not reversed, so that the charge amount including the imprinted charge amount is Pnon+Pi. The composite charge amount of the dummy capacitor and the memory capacitor is Pnon+Pnon.

As shown above, in the present invention, it is possible to obtain a composite capacitance from which influences of residual capacitance caused by imprint polarizations, and further a high precision ferroelectric memory with small malfunctions.

In the embodiments described above, although the ferroelectric film was made of STN and PZT, it may be made of the ferroelectric of e.g. SBT or high permitivity dielectric film of e.g. BST.

As regards the structure, the ferroelectric layer may be formed in a split structure and modified if appropriate.

In the embodiments, a memory capacitor and a dummy capacitor were used for a single select transistor. However, the invention should not be limited to such an arrangement, but can be applied to any other device using a ferroelectric capacitor.

Furthermore, the invention can be applied the ferroelectric memory in an MFSFET structure in which the gate dielectric film of an MOSFET is formed of a ferroelectric film as a second embodiment.

Figure 9:
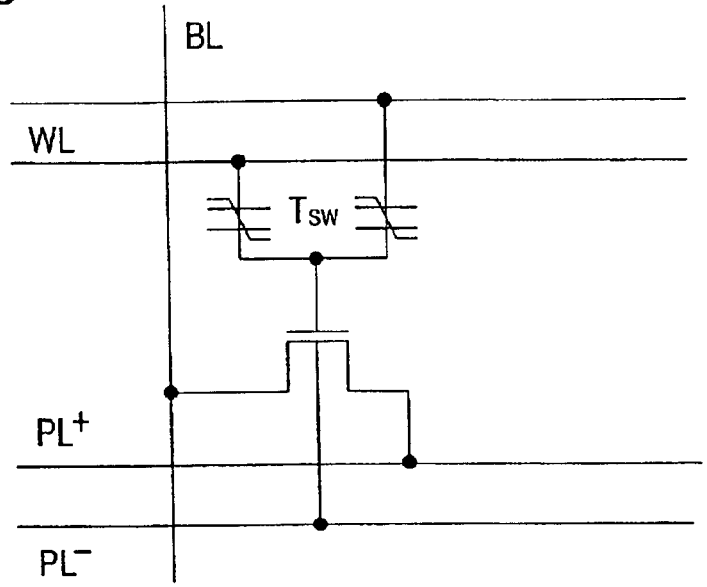
FIG. 9 is a view of an equivalent circuit of the ferroelectric memory according to the second embodiment of the invention.
Figure 10:
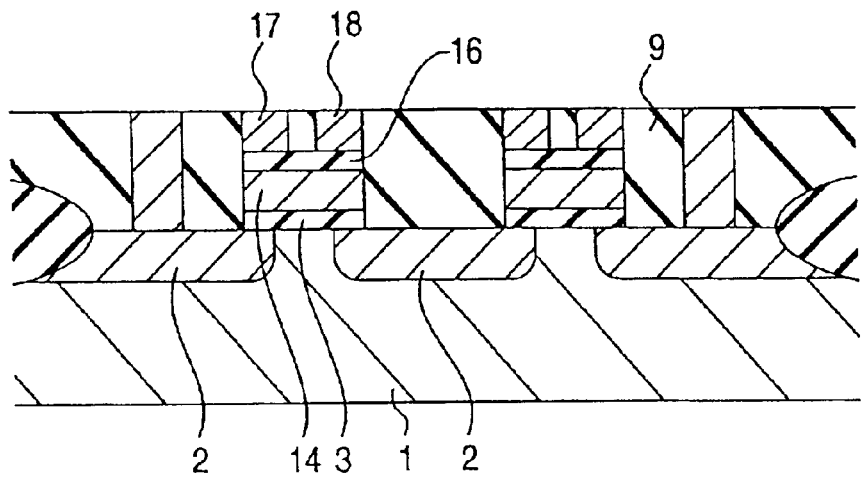
FIG. 10 is a view showing the structure of the ferroelectric memory according to the second embodiment of the invention.

FIG. 9 is an equivalent circuit diagram of the ferroelectric memory, and FIG. 10 is a sectional view thereof. As seen from these figures, the ferroelectric memory is characterized in that gate electrode includes a first electrode 14, a second ferroelectric film 17 and a third ferroelectric film 18 which are divided, and the second and the third electrodes are set so as to polarize them in opposite directions to each other at data writing.

As seen from the sectional view of FIG. 10, the MFSFET structure of ferroelectric memory includes source/drain layers 2 of p-type impurity regions formed on the surface of an n-type Si substrate 1 and a first gate electrode 14 formed between the source/drain regions through a gate insulating film 3 of a first ferroelectric film; a second ferroelectric film 16 formed on the first gate electrode 14; and the second and the third gate electrodes 17, 18 formed on the second ferroelectric film 16 having equal areas. And the second and third electrodes are held at predetermined potentials so that the ferroelectric film corresponding to the second and third electrodes to polarize them in opposite directions to each other at data writing.

In accordance with the present invention described hitherto, there is provided a ferroelectric memory which can cancel the imprint characteristic to have advantages of a long life, good characteristic and great reliability.

What is claimed is:

1. A ferroelectric capacitor comprising:
a first capacitor and a second capacitor having the first electrodes (storage node electrodes) connected to each other and drawing the same hysteresis curve, the second electrodes of these first and second capacitors are connected to a first plate line and a second plate line, respectively and the potentials of these plate lines are set so as to polarize the first capacitor and the second capacitor in opposite directions to each other with respect to the first electrodes so as to read out residual capacitance which remains in the first capacitor and the second capacitor when a voltage is applied to a second electrode.

2. A ferroelectric capacitor according to claim 1, wherein said ferroelectric capacitor is formed in a sandwiching structure in which a ferroelectric layer is sandwiched between said first electrodes which are a common electrode connected to one of the source and drain of a select transistor and the second electrodes which are first and the second individual electrodes connected to the first and the second plate line, respectively.

3. A ferroelectric capacitor according to claim 2, wherein the first and the second ferroelectric film are made of any one of PZT and SBT.

4. A ferroelectric capacitor according to claim 2, wherein the first electrode is made of two layer structure film of iridium and iridium oxide.

5. A ferroelectic capacitor according to claim 4, wherein the second individual electrode is made of two layer structure film of iridium and iridium oxide.

6. A ferroelectric memory comprising a select transistor and a ferroelectric capacitor characterized in that the ferroelectric capacitor includes a dummy capacitor and a memory capacitor the first electrodes (storage node electrodes) of which are connected to one of the source and drain of the select transistor and which draw the same hysteresis curve, the second electrodes of the dummy capacitor and the memory capacitor are connected to a first plate line and a second plate line, respectively, and the potentials of these plate lines are set so as to polarize the dummy capacitor and the memory capacitor in opposite directions to each other with respect to the first electrode so as to read out residual capacitance which remains in the dummy capacitor and the memory capacitor when a voltage is applied to a second electrode.

7. A ferroelectric memory according to claim 6, wherein said ferroelectric capacitor is formed in a sandwiching structure in which a ferroelectric layer is sandwiched between said first electrodes which are a common electrode connected to one of the source and drain of said select transistor and the second electrodes which are first and second individual electrodes connected to the first and the second plate line, respectively.

8. A ferroelectric memory according to claim 7, wherein the first and the second ferroelectric film are made of any one of PZT and SBT.

9. A ferroelectric memory according to claim 8, wherein the second individual electrode is made of two layer structure film of iridium and iridium oxide.

10. A ferroelectric memory according to claim 8, wherein the second individual electrode is made of two layer structure film of iridium and iridium oxide.

11. A ferroelectric memory according to claim 6, wherein polarization directions of said dummy capacitor and said memory capacitor are set to opposite direction to each other at a memory writing operation.

12. A ferroelectric memory structured MFSFET comprising:

source/drain layers formed on the surface of a semiconductor substrate and a first gate electrode formed between the source/drain regions through a gate insulating film of a first ferroelectric film; a second ferroelectric film formed on the first gate electrode; and second and third gate electrodes formed on the second ferroelectric film having equal areas, wherein the second and third electrodes are held at predetermined potentials so that the ferroelectric film corresponding to the second and third electrodes holds their polarization in opposite directions to each other.

13. A ferroelectric memory according to claim 12, wherein said second gate electrode and said third gate electrode are given electric potentials so as to polarize ferroelectric layers below the second and third gate electrodes in opposite directions to each other at a memory write operation.

14. A ferroelectric memory according to claim 12, wherein the first and the second ferroelectric film are made of any one of PZT and SBT.

15. A ferroelectric memory according to claim 12, wherein the first electrode is made of two layer structure film of iridium and iridium oxide.

16. A ferroelectric memory according to claim 12, wherein the second individual electrode is made of two layer structure film of iridium and iridium oxide.

17. A method of writing to and reading from a ferroelectric memory comprising a select transistor and ferroelectric capacitors, said ferroelectric memory is further characterized by that said ferroelectric capacitors include a dummy capacitor and a memory capacitor the first electrodes (storage node electrodes) of which are connected to one of the source and drain of the select transistor and which draw the same hysteresis curve, and that said second electrodes of the dummy capacitor and the memory capacitor are connected to a first plate line and a second plate line, respectively;

including:

a step of setting electric potentials of said first plate line and said second plate line so as to polarize said dummy capacitor and said memory capacitor in opposite directions at a memory write operation, and a step of reading out residual capacitance which remains in the dummy capacitor and the memory capacitor when a voltage is applied to a second electrode.

18. A method of reading from and writing to a ferroelectric memory according to claim 17, wherein the step of reading out includes steps of:

a step of giving a read out preparation electric potential to said first plate line; and a step of giving a read out electric potential to said second plate line.

* * * * *